(12) United States Patent
Sato

(10) Patent No.: US 9,825,160 B2
(45) Date of Patent: Nov. 21, 2017

(54) SEMICONDUCTOR DEVICE

(71) Applicant: Toyota Jidosha Kabushiki Kaisha, Toyota-shi, Aichi-ken (JP)

(72) Inventor: Tomohiko Sato, Nissin (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 15/434,199

(22) Filed: Feb. 16, 2017

(65) Prior Publication Data
US 2017/0243964 A1 Aug. 24, 2017

(30) Foreign Application Priority Data
Feb. 19, 2016 (JP) .................................. 2016-030386

(51) Int. Cl.
| H01L 29/74 | (2006.01) |
| H01L 31/111 | (2006.01) |
| H01L 29/739 | (2006.01) |
| H01L 29/06 | (2006.01) |
| H01L 29/417 | (2006.01) |
| H01L 29/423 | (2006.01) |
| H01L 23/367 | (2006.01) |

(52) U.S. Cl.
CPC ........ H01L 29/7397 (2013.01); H01L 23/367 (2013.01); H01L 29/0619 (2013.01); H01L 29/0696 (2013.01); H01L 29/41741 (2013.01); H01L 29/4236 (2013.01)

(58) Field of Classification Search
CPC ............. H01L 29/7397; H01L 29/0619; H01L 29/0696; H01L 29/41741; H01L 29/4236; H01L 23/367

USPC ........ 257/47, 144, 197, 205, 273, 477, 517, 257/526, 552, 565
See application file for complete search history.

(56) References Cited

U.S. PATENT DOCUMENTS

| 9,607,961 B2* | 3/2017 | Sato ........................ H01L 24/32 |
| 2014/0197451 A1* | 7/2014 | Chen .................. H01L 29/7393 257/139 |
| 2016/0351657 A1* | 12/2016 | Senoo ................... H01L 29/404 |
| 2017/0025516 A1* | 1/2017 | Saito ..................... H01L 21/046 |
| 2017/0025521 A1* | 1/2017 | Nakagawa .......... H01L 29/7397 |

FOREIGN PATENT DOCUMENTS

| JP | 2005116963 A | 4/2005 |
| JP | 2008091618 A | 4/2008 |
| JP | 2017-028069 A | 2/2017 |

* cited by examiner

*Primary Examiner* — Thien F Tran
(74) *Attorney, Agent, or Firm* — Dinsmore & Shohl LLP

(57) ABSTRACT

A semiconductor device includes: a semiconductor substrate; a main electrode; a peripheral electrode; an insulating protective film; a surface metallic layer; and a solder layer, wherein the semiconductor substrate includes: a first region of a first conductive-type in contact with the main electrode on a main contact surface; a second region of a first conductive-type in contact with the peripheral electrode on a peripheral contact surface; and a third region of a second conductive-type provided under the first region, under the second region, and circumferentially outward of the second region, and a circumferentially-outward end of the metallic layer and a circumferentially-outward end of the solder layer are located more circumferentially inward than the circumferentially-outward end of the peripheral electrode.

5 Claims, 7 Drawing Sheets

SEMICONDUCTOR DEVICE

CROSS-REFERENCE TO RELATED APPLICATIONS

This application claims priority to Japanese Patent Application No. 2016-030386 filed on Feb. 19, 2016, which is incorporated herein by reference in its entirety, including the specification, drawings and abstract.

BACKGROUND

1. Field of the Disclosure

A technique disclosed in the present specification relates to a semiconductor device.

2. Description of Related Art

A semiconductor device disclosed in Japanese Patent Application Publication No. 2008-91618 includes a semiconductor substrate, a main electrode, an insulating protective film, a surface metallic layer, and a solder layer. The main electrode is disposed on the semiconductor substrate. The insulating protective film covers the main electrode, and a part of an upper surface of the semiconductor substrate that is located more circumferentially outward than the main electrode. The insulating protective film has an opening above the main electrode. The surface metallic layer covers the main electrode located in the opening. The surface metallic layer is disposed only in the opening, and is not disposed on the insulating protective film. The solder layer is joined to the surface metallic layer.

SUMMARY

In the semiconductor device in JP 2008-91618 A, the surface metallic layer is disposed only in the opening of the insulating protective film, so that a circumferentially-outward end of the surface metallic layer is in contact with the main electrode. A circumferentially-outward end of the solder layer is in contact with the circumferentially-outward end of the surface metallic layer. In this structure, since both the main electrode and the surface metallic layer have a high thermal conductivity, heat is easily transferred from the main electrode via the surface metallic layer to the circumferentially-outward end of the solder layer. When the semiconductor device operates, a semiconductor region under the main electrode generates heat. The heat is then transferred from the semiconductor region to the main electrode. In addition, the heat is further transferred from the main electrode via the surface metallic layer to the circumferentially-outward end of the solder layer. Hence, a temperature of the circumferentially-outward end of the solder layer becomes high. A thermal stress is likely to be generated at the circumferentially-outward end of the solder layer having a fillet shape. Consequently, if this end has a high temperature, a high thermal stress is generated in the vicinity of this end.

The aspect of the present disclosure is a semiconductor device including: a semiconductor substrate; a main electrode in contact with a main contact surface on an upper surface of the semiconductor substrate; a peripheral electrode in contact with a peripheral contact surface annularly extending on the upper surface of the semiconductor substrate in a manner as to surround a periphery of the main contact surface on the upper surface of the semiconductor substrate, the peripheral electrode electrically connected to the main electrode; an insulating protective film covering the periphery of the main electrode, the peripheral electrode, and a part of the upper surface of the semiconductor substrate that is located more circumferentially outward than the peripheral electrode, the insulating protective film exposing a center of the main electrode; a surface metallic layer disposed on the main electrode and extending from the main electrode onto the insulating protective film; and a solder layer on the surface metallic layer, wherein the semiconductor substrate includes: a first region of a first conductive-type in contact with the main electrode on the main contact surface; a second region of the first conductive-type in contact with the peripheral electrode on the peripheral contact surface; and a third region of a second conductive-type provided under the first region, under the second region, and circumferentially outward of the second region, and a circumferentially-outward end of the metallic layer and a circumferentially-outward end of the solder layer are located more circumferentially inward than the circumferentially-outward end of the peripheral electrode.

In the present specification, an expression of "circumferentially outward" denotes a position closer to the circumferentially outward end surface of the semiconductor substrate, and an expression of "circumferentially inward" denotes a position closer to the opening of the insulating protective film. The aforementioned "first region" and "second region" may be connected to each other, or may be separated from each other. In the present specification, the first conductive-type denotes one of the p-type and the n-type, and the second conductive-type denotes the other type.

In this semiconductor device, the surface metallic layer covers the main electrode located in the opening of the insulating protective film and the insulating protective film located around the opening. Hence, the circumferentially-outward end of the surface metallic layer is disposed on the insulating protective film. Since the solder layer covers the surface metallic layer located in the opening and the surface metallic layer around the opening, the circumferentially-outward end of the solder layer is disposed on the insulating protective film. Specifically, the circumferentially-outward end of the surface metallic layer and the circumferentially-outward end of the solder layer are disposed on the insulating protective film. In this configuration, when the semiconductor substrate generates heat due to the operation of the semiconductor device, the heat is transferred from the semiconductor substrate via the insulating protective film and a surface electrode to the circumferentially-outward end of the solder layer. In general, since the insulating protective film has a lower thermal conductivity than that of a material (such as metal) configuring the electrode, the heat is hard to be transferred from the semiconductor substrate to the circumferentially-outward end of the solder layer. Therefore, according to this configuration, a high thermal stress is hard to be generated in the vicinity of the circumferentially-outward end of the solder layer. In addition, the circumferentially-outward end of the solder layer is disposed at a position apart from the main electrode, thus protecting the main electrode. When the semiconductor device is turned off, the depletion layer spreads from the second region to the third region located circumferentially outward of the second region. Through this, a difference in electric potential is generated in the depletion layer. This difference in electric potential is generated along the lateral direction (a direction from the circumferentially inward side to the circumferentially outward side) in the vicinity of the upper surface of the semiconductor substrate. If the surface metallic layer and the solder layer are disposed above the depletion layer, an electric potential distribution in the depletion layer becomes disturbed due to the electric potentials of the surface metallic layer and the solder layer; consequently, the pressure resistance of the semiconductor device becomes decreased. To the contrary, in the aforementioned semiconductor device, the circumferentially-outward end of the surface metallic layer and the circumferentially-outward end of the solder layer are disposed more circumferentially inward than the circumferentially-outward end of the peripheral electrode. Accordingly, it is possible to suppress disturbance of the electric potential distribution in the depletion layer located more circumferentially outward than the peripheral electrode. Since almost no difference in electric potential is generated in the lateral direction at a circumferentially inward position than the circumferentially-outward end of the peripheral electrode, the electric potential distribution in the semiconductor substrate is not disturbed even if the surface metallic layer and the solder layer are disposed in this range. Therefore, according to this configuration, it is possible to secure the pressure resistance of the semiconductor substrate.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
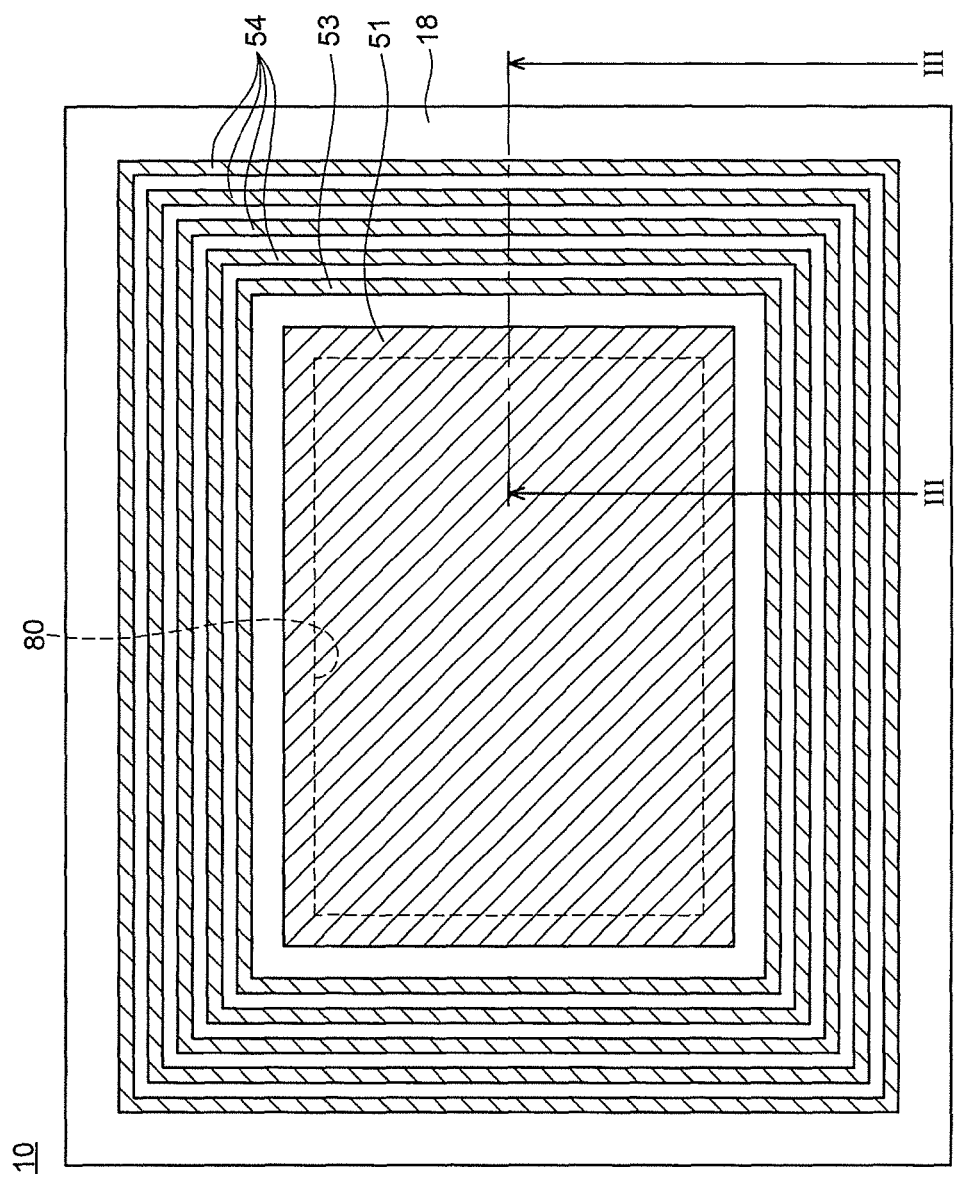
FIG. 1 is a plan view of an IGBT10 of Embodiment 1.
Figure 2:
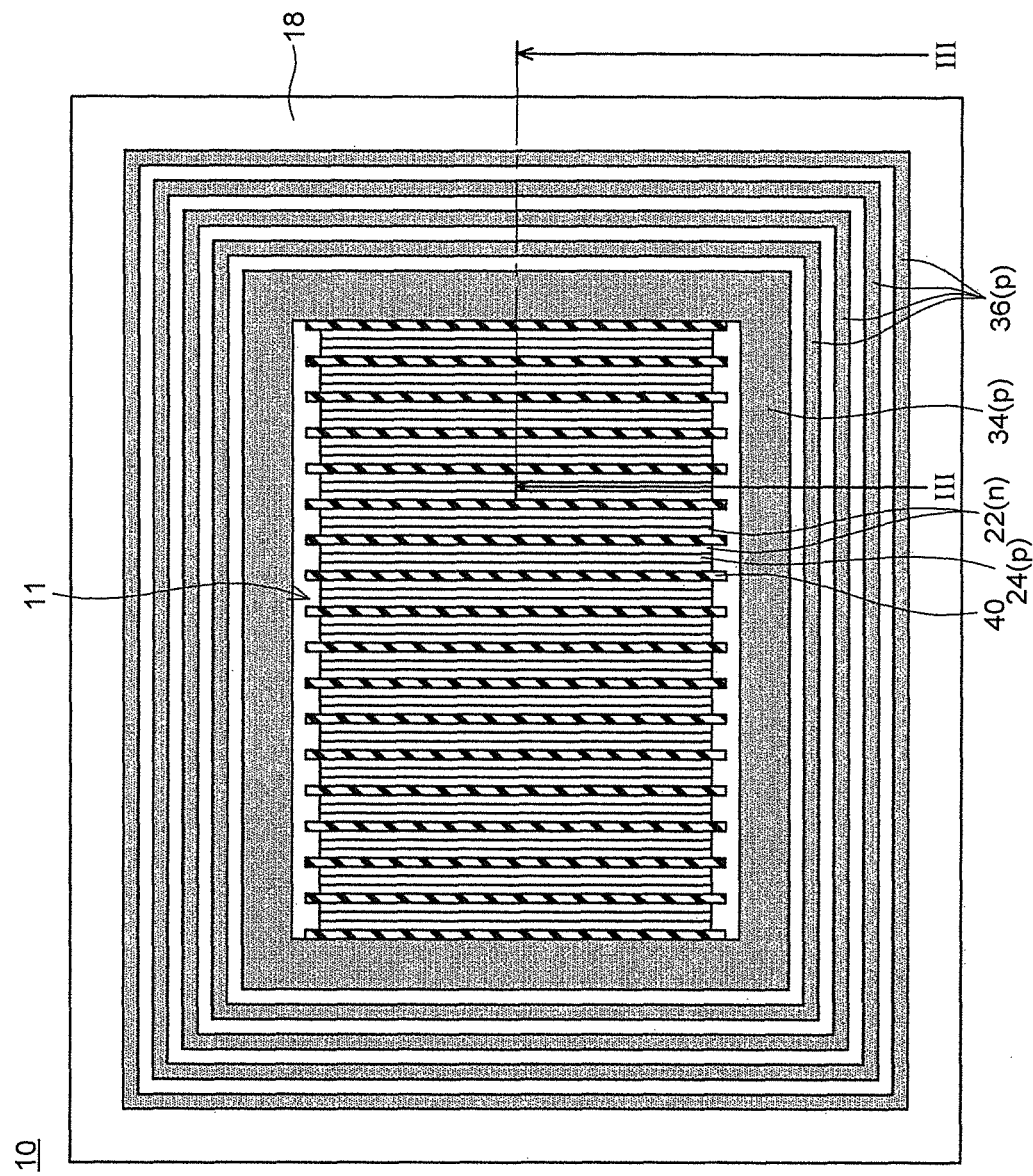
FIG. 2 is a plan view of the IGBT10 of Embodiment 1.
Figure 3:
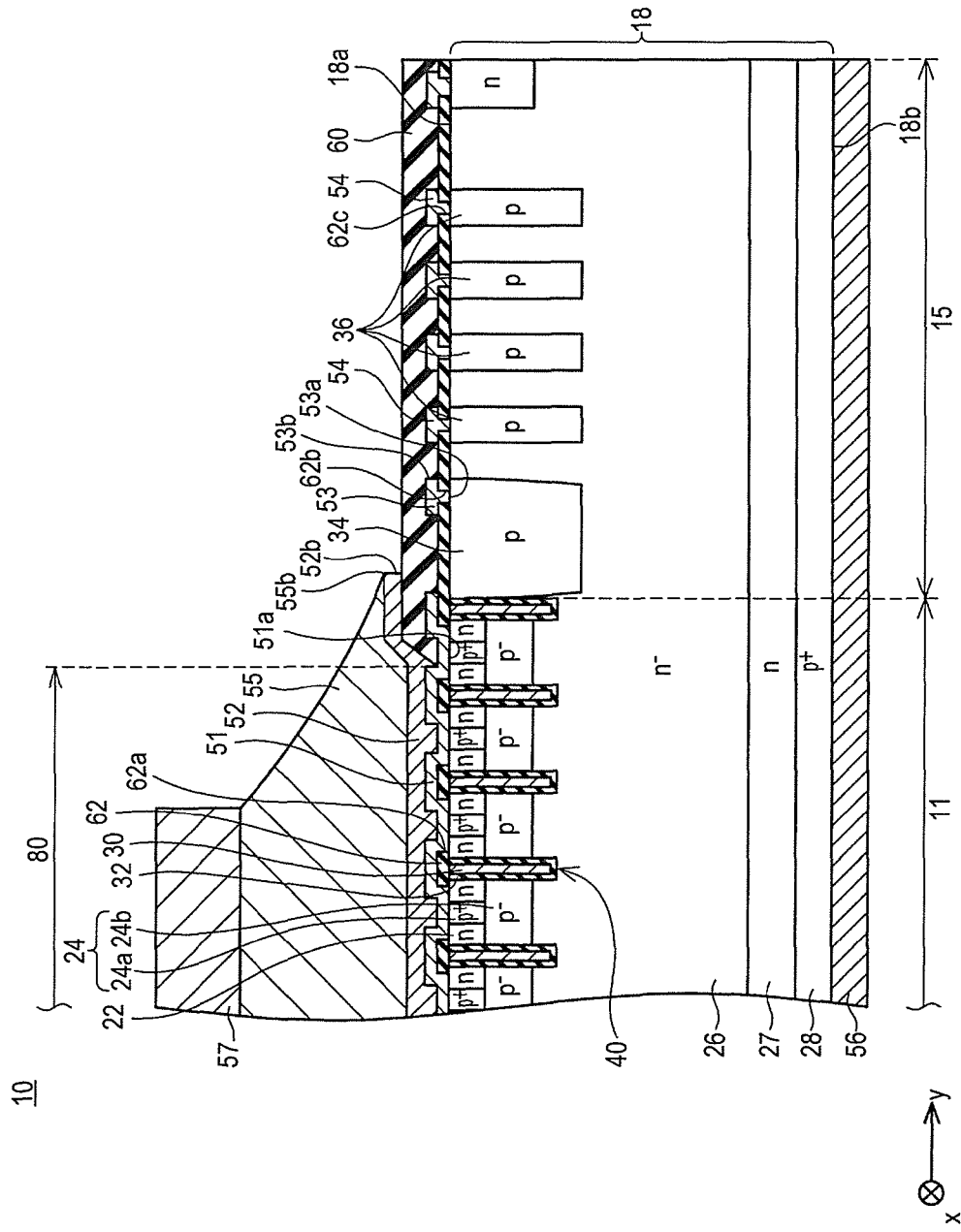
FIG. 3 is a longitudinal sectional view of the IGBT10 of Embodiment 1 (longitudinal sectional view taken along line III-III of FIG. 1 and FIG. 2)

An IGBT10 of an Embodiment as shown in FIG. 1 to FIG. 3 includes a semiconductor substrate 18, and electrodes and insulating protective films provided on an upper surface 18a and a lower surface 18b of the semiconductor substrate 18. FIG. 1 shows positions of the electrode and others in contact with the upper surface 18a of the semiconductor substrate 18. For convenience of understanding of the drawings, in FIG. 1, the electrode is hatched by oblique lines. In FIG. 2, the electrode and others on the upper surface 18a of the semiconductor substrate 18 are not illustrated, but a structure thereof exposed to the upper surface 18a of the semiconductor substrate 18 is shown. In FIG. 2, for convenience of understanding of the drawing, trenches are hatched by oblique lines, and p-type regions provided to a circumferentially outward part of the upper surface of the semiconductor substrate 18 is hatched by dots.

As shown in FIG. 2, multiple trenches 40 are provided on the upper surface 18a of the semiconductor substrate 18. Each trench 40 extends long in one direction. The multiple trenches 40 are arranged with intervals in a direction orthogonal to a longitudinal direction of the trenches 40.

As shown in FIG. 3, an inner surface of each trench 40 is covered with a gate insulating film 32. A gate electrode 30 is disposed in each trench 40. Each gate electrode 30 is electrically insulated from the semiconductor substrate 18 by the gate insulating film 32.

As shown in FIG. 2 and FIG. 3, an emitter region 22 and a body region 24 are disposed in a semiconductor region between each two adjacent trenches 40.

Each emitter region 22 is an n-type region. Two emitter regions 22 are provided in each semiconductor region between each two adjacent trenches 40. Each emitter region 22 is disposed in a range where the emitter region 22 is exposed to the upper surface 18a of the semiconductor substrate 18. Each emitter region 22 is in contact with each corresponding gate insulating film 32 at an uppermost position of each trench 40.

Each body region 24 is a p-type region. Each body region 24 is exposed to the upper surface 18a of the semiconductor substrate 18 between each two adjacent emitter regions 22. Each body region 24 extends from a position where the body region 24 is exposed to the upper surface 18a to a lower position of the emitter region 22. Each body region 24 includes a high-concentration region 24a, and a low-concentration region 24b having a lower p-type impurity concentration than that of the high-concentration region 24a. Each high-concentration region 24a is disposed in a range where the high-concentration region 24a is exposed to the upper surface 18a. Each low-concentration region 24b is disposed under each corresponding emitter region 22. Each low-concentration region 24b is disposed under each corresponding emitter region 22, and is in contact with the gate insulating films 32.

The semiconductor regions in a range where the trenches 40, the emitter regions 22, and the body regions 24 are disposed are regions through which a principal current flows when the IGBT 10 is turned on. A zone where the trenches 40, the emitter regions 22, and the body regions 24 are disposed is referred to as an element zone 11, hereinafter. A zone outward of the element zone 11 is referred to as a circumferentially-outward pressure-resistant zone 15.

As shown in FIG. 2 and FIG. 3, a terminal region 34 and multiple FLRs (field limiting rings) 36 are provided in the circumferentially-outward pressure-resistant zone 15.

The terminal region 34 is disposed in a range where the terminal region 34 is exposed to the upper surface 18a of the semiconductor substrate 18. As shown in FIG. 2, the terminal region 34 annularly extends in a manner as to surround a periphery of the element zone 11. As shown in FIG. 3, the terminal region 34 is disposed at a position adjacent to a most circumferentially outward trench 40. The terminal region 34 is separated from the body region 24 by the most circumferentially outward trench 40. The terminal region 34 extends from the upper surface 18a to a position more downward than a lower end of the trench 40.

Each FLR 36 is disposed in a range where the FLR 36 is exposed to the upper surface 18a of the semiconductor substrate 18. As shown in FIG. 2, the terminal region 34 is surrounded by multiple rounds of the multiple FLRs 36. As shown in FIG. 3, each FLR 36 extends from the upper surface 18a to a position more downward than the lower end of each trench 40. Each FLR 36 is separated from the body regions 24 and the terminal region 34. Each FLR 36 is separated from each other.

As shown in FIG. 3, the semiconductor substrate 18 includes a drift region 26, a buffer region 27, and a collector region 28.

The drift region 26 is an n-type region having a low n-type impurity concentration. As shown in FIG. 3, the drift region 26 is distributed across the entire element zone 11 and the entire circumferentially-outward pressure-resistant zone 15. The drift region 26 is disposed under the body regions 24 in the element zone 11, and is in contact with the body regions 24 from lower parts of the body regions 24. The drift region 26 is separated from the emitter regions 22 by the body regions 24 in the element zone 11. In the element zone 11, the drift region 26 is in contact with the gate insulating films 32 under the body regions 24. This means that via the gate insulating films 32, the gate electrodes 30 face the body regions 24 located in the range where the drift region 26 is separated from the emitter regions 22. In the circumferentially-outward pressure-resistant zone 15, the drift region 26 is distributed under the entire terminal region 34 and circumferentially outward of the entire terminal region 34. The drift region 26 is in contact with the terminal region 34 from the lower part and the circumferentially outward part of the terminal region 34. The terminal region 34 is separated from the FLRs 36 by the drift region 26. The drift region 26 extends under each entire FLR 36 and circumferentially outward of each entire FLR 36. The drift region 26 is in contact with each FLR 36. Each FLR 36 is separated from each other by the drift region 26.

The buffer region 27 is an n-type region having a higher n-type impurity concentration than that of the drift region 26. The buffer region 27 is distributed across the entire element zone 11 and the entire circumferentially-outward pressure-resistant zone 15. The buffer region 27 is disposed under the drift region 26, and is in contact with the drift region 26 from a lower part of the drift region 26.

The collector region 28 is a p-type region. The collector region 28 is distributed across the entire element zone 11 and the entire circumferentially-outward pressure-resistant zone 15. The collector region 28 is disposed under the buffer region 27, and is in contact with the buffer region 27 from a lower part of the buffer region 27. The collector region 28 is exposed to the lower surface 18b of the semiconductor substrate 18.

As shown in FIG. 3, inter-layer insulating films 62, a main electrode 51, a peripheral electrode 53, multiple annular electrodes 54, an insulating protective film 60, a surface metallic layer 52, a solder layer 55, and a metallic block 57 are respectively disposed on the semiconductor substrate 18.

The inter-layer insulating films 62 are disposed on the upper surface 18a of the semiconductor substrate 18. The inter-layer insulating films 62 extend across the entire element zone 11 and the entire circumferentially-outward pressure-resistant zone 15. An entire upper surface of each gate electrode 30 is substantially covered with each corresponding inter-layer insulating film 62. A contact hole 62a extending through each corresponding inter-layer insulating film 62 in a vertical direction is provided to an upper part of the semiconductor region located between each two adjacent trenches 40. A contact hole 62b is provided to an upper part of the terminal region 34. The contact hole 62b annularly extends along the terminal region 34 as shown in FIG. 2. A contact hole 62c is provided to an upper part of each FLR 36. Each contact hole 62c annularly extends along each corresponding FLR 36.

The main electrode 51 covers each inter-layer insulating film 62 in the element zone 11. The main electrode 51 is in contact with the upper surface 18a of the semiconductor substrate 18 in each contact hole 62a. Hereinafter, a boundary surface where the main electrode 51 and the semiconductor substrate 18 are in contact with each other is referred to as a contact surface 51a. The main electrode 51 is in ohmic contact with the emitter region 22 and the high-concentration region 24a in each contact hole 62a (i.e., at the contact surface 51a). The main electrode 51 is electrically insulated from each gate electrode 30 by each corresponding inter-layer insulating film 62. The main electrode 51 is configured by AlSi (an alloy of aluminum and silicon).

The peripheral electrode 53 is disposed on the terminal region 34. As shown in FIG. 1, the peripheral electrode 53 annularly extends along the terminal region 34. As shown in FIG. 3, the peripheral electrode 53 is in ohmic contact with the terminal region 34 in the contact hole 62b. The contact hole 62b annularly extends along the terminal region 34, and thus a contact surface 53a between the peripheral electrode 53 and the terminal region 34 annularly extends in a manner as to surround a periphery of the element zone 11 (i.e., the contact surface 51a).

The respective multiple annular electrodes 54 are disposed on the corresponding FLRs 36. As shown in FIG. 1, each annular electrode 54 annularly extends along each corresponding FLR 36. As shown in FIG. 3, each of the multiple annular electrodes 54 is in ohmic contact with each corresponding FLR 36 in each corresponding contact hole 62c.

In the circumferentially-outward pressure-resistant zone 15, the insulating protective film 60 covers a circumferentially-outward end of the main electrode 51, the inter-layer insulating film 62, the peripheral electrode 53, and the multiple annular electrodes 54. The insulating protective film 60 has an opening 80 at a center of the upper surface 18a of the semiconductor substrate 18. The opening 80 is provided in the element zone 11. As shown in FIG. 1, the opening 80 is disposed above the main electrode 51. The insulating protective film 60 is configured by a resin (e.g., polyimide). The insulating protective film 60 has a smaller thermal conductivity than those of the main electrode 51 and the surface metallic layer 52.

The surface metallic layer 52 covers the main electrode 51 in the opening 80, and the insulating protective film 60 located around the periphery of the opening 80. Specifically, a circumferentially outward part of the surface metallic layer 52 is overlaid on the insulating protective film 60. A circumferentially-outward end 52b of the surface metallic layer 52 is disposed on the terminal region 34. The circumferentially-outward end 52b of the surface metallic layer 52 is disposed circumferentially inward of a circumferentially-outward end 53b of the peripheral electrode 53. The surface metallic layer 52 is configured by nickel. The surface metallic layer 52 (i.e., nickel) has a high solder wettability. The surface metallic layer 52 is electrically connected to the peripheral electrode 53 through not-illustrated wiring. Hence, an electric potential of the surface metallic layer 52 is substantially equal to an electric potential of the peripheral electrode 53.

The solder layer 55 is joined to the surface metallic layer 52. The solder layer 55 covers an entire surface of the surface metallic layer 52. The metallic block 57 is disposed on the solder layer 55. The surface metallic layer 52 and the metallic block 57 are electrically connected to each other by the solder layer 55. In the vicinity of a circumferentially-outward end 55b of the solder layer 55, the solder layer 55 has a fillet shape of which thickness becomes gradually greater as the solder layer 55 comes apart from the circumferentially-outward end 52b of the surface metallic layer 52. The circumferentially-outward end 55b of the solder layer 55 is disposed on the circumferentially-outward end 52b of the surface metallic layer 52. Hence, the circumferentially-outward end 55b of the solder layer 55 is disposed above the terminal region 34. The circumferentially-outward end 55b of the solder layer 55 is disposed more circumferentially inward than the circumferentially-outward end 53b of the peripheral electrode 53.

A lower electrode 56 is disposed to the lower surface 18b of the semiconductor substrate 18. The lower electrode 56 is in ohmic contact with the collector region 28.

Operation of the IGBT 10 will be described, hereinafter. The IGBT 10 is used in a state in which voltage is applied between the main electrode 51 and the lower electrode 56 such that the lower electrode 56 has a higher electric potential. If a higher electric potential than a threshold value is applied to the gate electrodes 30, a channel is formed in each body region 24 in a range of being adjacent to the gate insulating film 32. Each emitter region 22 is connected to the drift region 26 by this channel. Consequently, electrons flow from the main electrode 51 via the emitter regions 22, the channels, the drift region 26, the buffer region 27, and the collector region 28 to the lower electrode 56. Electron holes flow from the lower electrode 56 via the collector region 28, the buffer region 27, the drift region 26, and the body regions 24 to the main electrode 51. In other words, the IGBT 10 is turned on, and current flows from the lower electrode 56 to the main electrode 51.

When the IGBT 10 is turned on, most of the current flows through the element zone 11. The current also flows through the drift region 26 in the circumferentially-outward pressure-resistant zone 15, but a current density in the circumferentially-outward pressure-resistant zone 15 is further smaller than a current density in the element zone 11. When the IGBT 10 is turned on, the semiconductor substrate 18 generates heat. Since the current density in the circumferentially-outward pressure-resistant zone 15 is smaller than the current density in the element zone 11, a calorific value in the circumferentially-outward pressure-resistant zone 15 is smaller than a calorific value in the element zone 11.

The heat generated in the semiconductor substrate 18 is transferred via the solder layer 55 to the metallic block 57. The metallic block 57 transfers the heat to a not-illustrated radiating member. In this manner, the heat generated in the semiconductor substrate 18 is radiated so as to prevent the semiconductor substrate 18 from having an excessively high temperature.

In the opening 80, the heat is transferred from the semiconductor substrate 18 in the element zone 11 via the main electrode 51 and the surface metallic layer 52 to the solder layer 55. Above the contact surface 51a, the semiconductor substrate 18 is in direct contact with the main electrode 51, the main electrode 51 is in direct contact with the surface metallic layer 52, and the surface metallic layer 52 is in direct contact with the solder layer 55, respectively. Both the main electrode 51 and the surface metallic layer 52 have a high thermal conductivity. This means that no member for blocking thermal conduction is present between the contact surface 51a and the solder layer 55. In addition, the calorific value in the element zone 11 is greater. Hence, a great quantity of heat is transferred to the solder layer 55 located at an upper position in the opening 80, and thus a temperature of the solder layer 55 located at the upper position in the opening 80 becomes higher.

On the other hand, the circumferentially-outward end 55b of the solder layer 55 is disposed on the insulating protective film 60 in the circumferentially-outward pressure-resistant zone 15. The inter-layer insulating film 62, the insulating protective film 60, and the surface metallic layer 52 are interposed between the circumferentially-outward end 55b of the solder layer 55 and the semiconductor substrate 18. Accordingly, the heat generated in the semiconductor substrate 18 in the circumferentially-outward pressure-resistant zone 15 is transferred via the inter-layer insulating film 62, the insulating protective film 60, and the surface metallic layer 52 to the circumferentially-outward end 55b of the solder layer 55. Since the insulating protective film 60 has a small thermal conductivity, the heat is hard to be transferred to the circumferentially-outward end 55b of the solder layer 55. In addition, the calorific value in the circumferentially-outward pressure-resistant zone 15 is smaller. Hence, a quantity of heat transferred to the circumferentially-outward end 55b of the solder layer 55 is small, thus suppressing increase in temperature of the circumferentially-outward end 55b of the solder layer 55.

Since the solder layer 55 has a fillet shape at the vicinity of the circumferentially-outward end 55b of the solder layer 55, a thermal stress is likely to be generated at the time of temperature increase in the vicinity of the circumferentially-outward end 55b of the solder layer 55. However, as aforementioned, in this IGBT 10, increase in temperature of the circumferentially-outward end 55b of the solder layer 55 is suppressed. Hence, it is possible to prevent an excessively high thermal stress from being generated in the vicinity of the circumferentially-outward end 55b of the solder layer 55. Through this, the solder layer 55 and the surface metallic layer 52 are protected in the vicinity of the circumferentially-outward end 55b of the solder layer 55. Although the solder layer 55 has a higher temperature at the upper position in the opening 80, the circumferentially-outward end 55b of the solder layer 55 is not present at the upper position in the opening 80; therefore, no excessively high stress is generated in the solder layer 55. Accordingly, the solder layer 55, the surface metallic layer 52, and the main electrode 51 are protected in the opening 80.

If an electric potential of the gate electrodes 30 is decreased to be lower than a threshold value, the channels disappear so that the current is stopped. In the element zone 11, a depletion layer then spreads from the body regions 24 through the drift region 26. The drift region 26 has an excessively low n-type impurity concentration, and thus the depletion layer spreads long from the body regions 24 in a downward direction. Consequently, the drift region 26 in the element zone 11 becomes depleted in a wide range.

In the circumferentially-outward pressure-resistant zone 15, the depletion layer spreads from the terminal region 34 through the drift region 26. The depletion layer spreads under the terminal region 34, as similar to the inside of the element zone 11. In the outer circumference of the terminal region 34, the depletion layer spreads from the terminal region 34 in the circumferentially outward direction (lateral direction). When the depletion layer reaches the FLR 36 located at the circumferentially innermost position, the depletion layer further spreads from this FLR 36 in the circumferentially outward direction. When the depletion layer reaches a next FLR 36, the depletion layer further spreads in the circumferentially outward direction. In this manner, the depletion layer spreads via the multiple FLRs 36 in the circumferentially outward direction, so that the depletion layer spreads to a vicinity of a circumferentially-outward end surface of the semiconductor substrate 18.

In the depleted drift region 26, a difference in electric potential is generated. In the drift region 26 in the element zone 11 under the terminal region 34, a difference in electric potential is generated in the vertical direction. This means that the electric potential becomes gradually lower from the lower position toward the upper position. In the drift region 26 located circumferentially outward of the terminal region 34, a difference in electric potential is generated in the lateral direction in the vicinity of the upper surface 18a of the semiconductor substrate 18. Specifically, the electric potential becomes gradually lower from the circumferentially outward position toward the circumferentially-inward position. At a more circumferentially inward position than the circumferentially-outward end 53b of the peripheral electrode 53, in the vicinity of the upper surface 18a of the semiconductor substrate 18, almost no difference in electric potential is generated in the lateral direction. This is because the respective electric potentials of the peripheral electrode 53 and the main electrode 51 are substantially the same.

Figure 4:
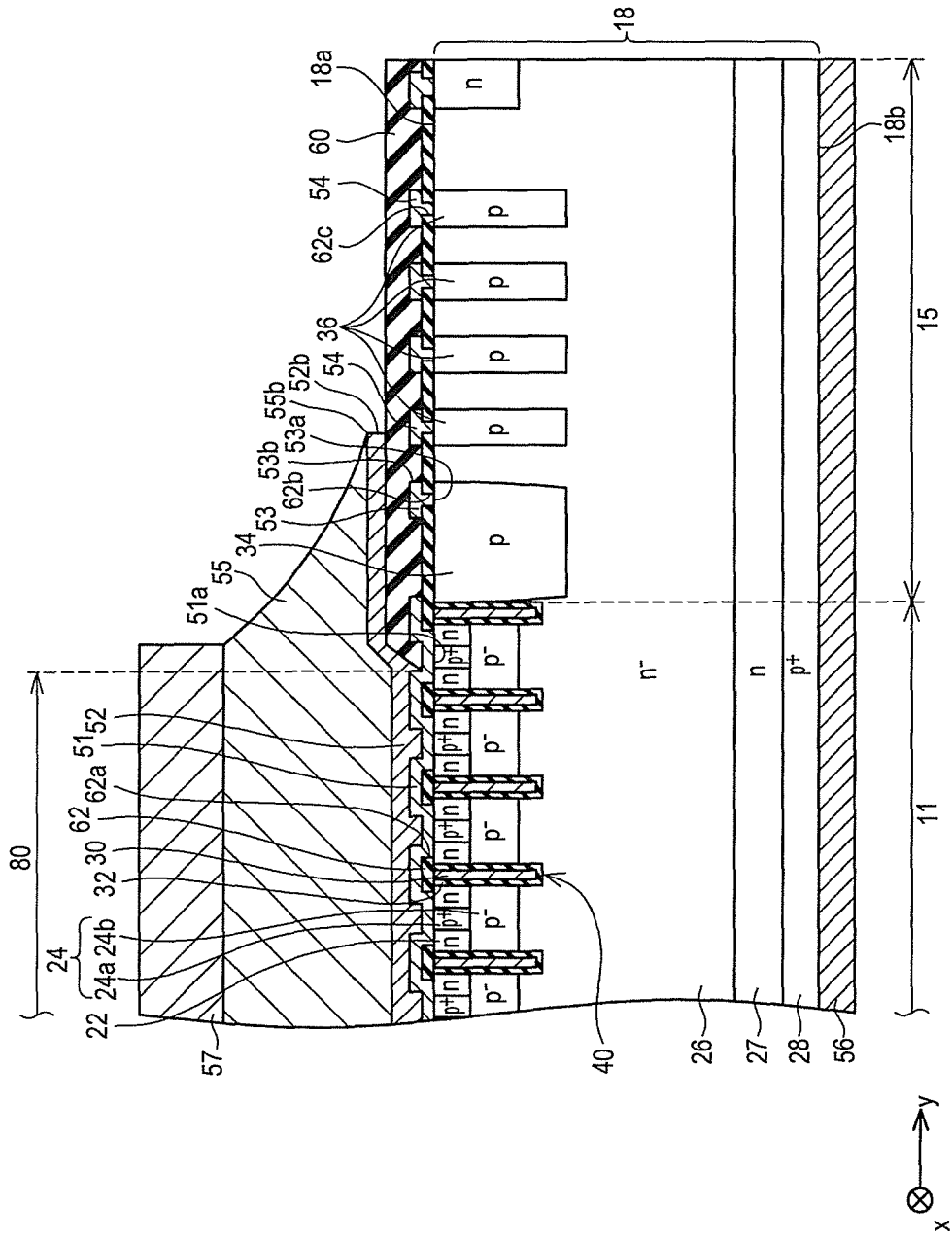
FIG. 4 is a longitudinal sectional view of an IGBT of Comparative Example.

As shown in FIG. 4, if the surface metallic layer 52 and the solder layer 55 extend to a more circumferentially outward position than the circumferentially-outward end 53b of the peripheral electrode 53, an electric potential distribution in the drift region 26 located circumferentially outward of the terminal region 34 becomes disturbed due by influence of the electric potentials (i.e., low electric potentials) of the surface metallic layer 52 and the solder layer 55. Consequently, an electric field concentration is likely to be caused in the drift region 26 located circumferentially outward of the terminal region 34, and also in the periphery thereof, so that a pressure resistance of the IGBT becomes lower. As shown in FIG. 3, if the circumferentially-outward end 52b of the surface metallic layer 52 and the circumferentially-outward end 55b of the solder layer 55 are located more circumferentially inward than the circumferentially-outward end 53b of the peripheral electrode 53, the electric field distribution in the drift region 26 located circumferentially outward of the terminal region is not disturbed. At a more circumferentially inward position than the circumferentially-outward end 53b of the peripheral electrode 53, almost no difference in electric potential in the lateral direction is caused in the vicinity of the upper surface 18a of the semiconductor substrate 18; therefore, no influence is caused to the electric field distribution even if the surface metallic layer 52 and the solder layer 55 are disposed in this range. Hence, according to the structure of the IGBT 10 of Embodiment 1, it is possible to secure the pressure resistance of the IGBT 10.

As aforementioned, according to the structure of Embodiment 1, the solder layer 55, the surface metallic layer 52, and the main electrode 51 are protected. According the structure of Embodiment 1, it is possible to secure the pressure resistance of the IGBT 10.

Figure 5:
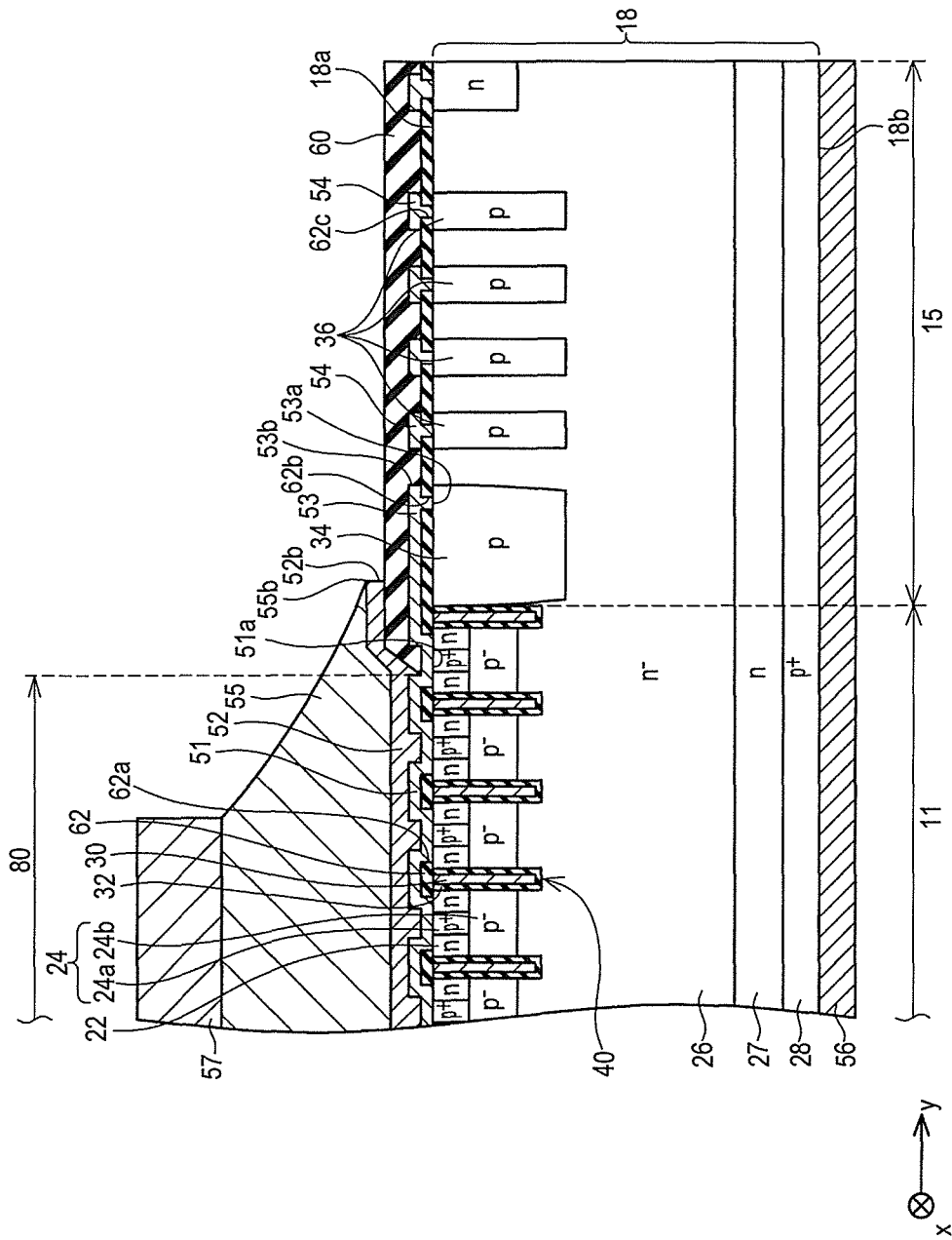
FIG. 5 is a longitudinal sectional view of an IGBT of a Variation.

In Embodiment 1, the main electrode 51 and the peripheral electrode 53 are separated from each other on the semiconductor substrate 18, and are electrically connected to each other through not-illustrated wiring. However, as shown in FIG. 5, the main electrode 51 and the peripheral electrode 53 may be connected to each other on the interlayer insulating film 62.

In Embodiment 1, the terminal region 34 is separated from the body regions 24. However, the terminal region 34 may be connected to the body regions 24.

Figure 6:
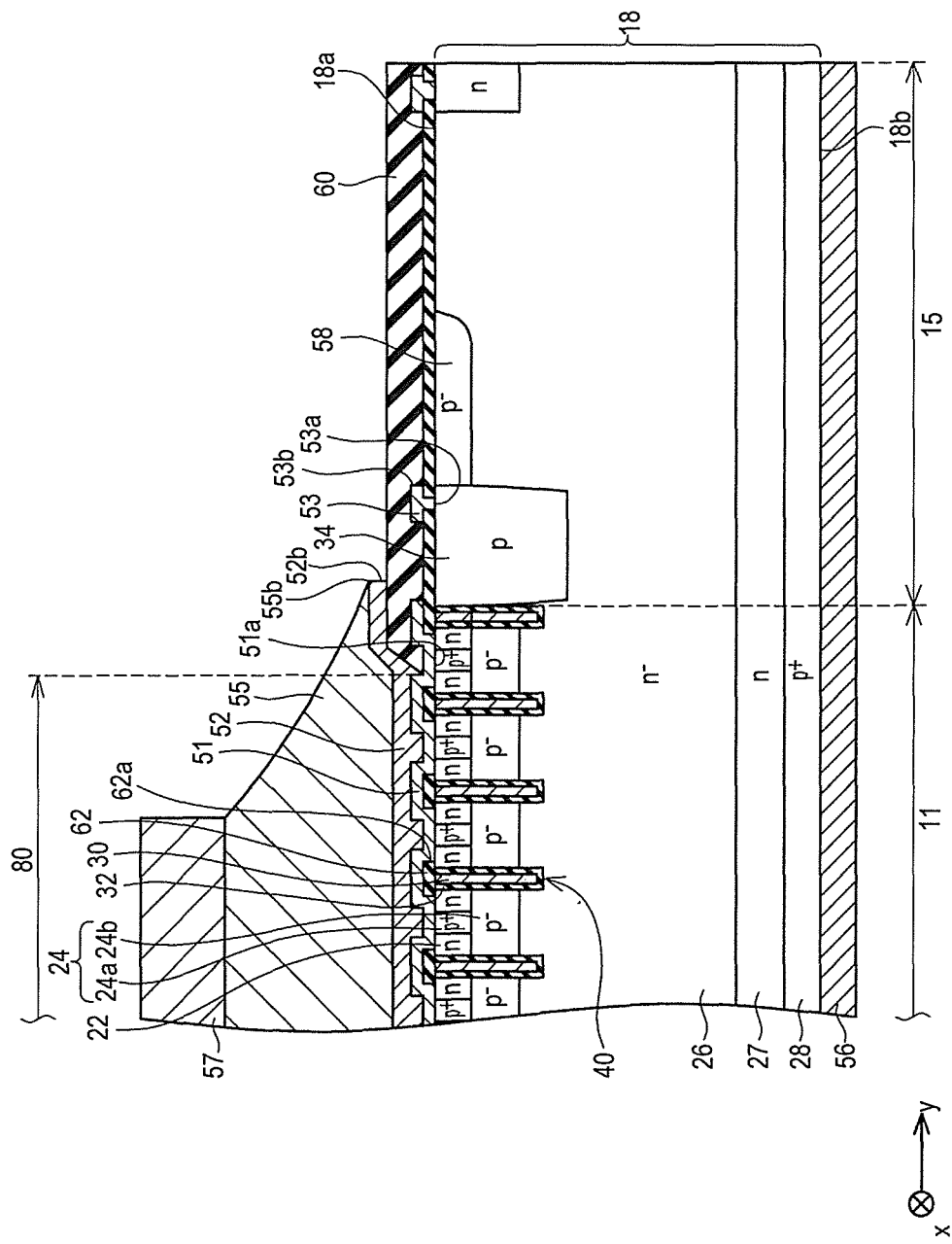
FIG. 6 is a longitudinal sectional view of an IGBT of Embodiment 2.

An IGBT of Embodiment 2 as shown in FIG. 6 includes a RESURF layer 58 instead of the FLRs 36 of Embodiment 1. The RESURF layer 58 is a p-type region, and is provided in a range where the RESURF layer 58 is exposed to the upper surface 18a of the semiconductor substrate 18. The RESURF layer 58 extends from the terminal region 34 in the circumferentially outward direction. The RESURF layer 58 has a lower p-type impurity concentration than that of the terminal region 34. The drift region 26 is provided under and circumferentially outward of the RESURF layer 58. The other configurations of the IGBT of Embodiment 2 are equal to those of the IGBT 10 of Embodiment 1.

Operation of the IGBT of Embodiment 2 during being turned on is substantially equal to that of the IGBT 10 of Embodiment 1. In the IGBT of Embodiment 2, the circumferentially-outward end 55b of the solder layer 55 is disposed on the insulating protective film 60, and above the terminal region 34. Hence, increase in temperature of the circumferentially-outward end 55b of the solder layer 55 is suppressed.

There is a difference between Embodiment 1 and Embodiment 2 in the spreading manner of the depletion layer in the circumferentially-outward pressure-resistant zone 15 when the IGBT is turned off. In Embodiment 2, when the IGBT is turned off, the depletion layer spreads from a p-n junction at a boundary surface between the RESURF layer 58 and the drift region 26 through the RESURF layer 58 and the drift region 26. The substantially entire RESURF layer 58 is depleted. The drift region 26 is depleted to the vicinity of the circumferentially-outward end surface of the semiconductor substrate 18. In the vicinity of the upper surface 18a of the semiconductor substrate 18 located circumferentially outward of the terminal region 34, a difference in electric potential in the lateral direction is generated in the depletion layer spreading through the RESURF layer 58 and the drift region 26. Specifically, the electric potential becomes gradually lower from the circumferentially outward side toward the circumferentially inward side. In the IGBT of Embodiment 2, the circumferentially-outward end 52b of the surface metallic layer 52 and the circumferentially-outward end 55b of the solder layer 55 are located more circumferentially inward than the circumferentially-outward end 53b of the peripheral electrode 53. Hence, it is possible to prevent disturbance of the electric field of the RESURF layer 58 and the drift region 26 located circumferentially outward of the circumferentially-outward end 53b of the peripheral electrode 53. Therefore, according to the structure of the IGBT of Embodiment 2, it is possible to secure the pressure resistance of the IGBT.

In aforementioned Embodiments 1 and 2, each IGBT has been described, and the configurations of Embodiments 1 and 2 may be applied to a MOSFET. In Embodiments 1 and 2, an n-type region (drain region) in ohmic contact with the lower electrode 56 may be provided instead of the collector region 28, thereby obtaining an n-channel-type MOSFET. By reversing a p-type region to an n-type region, and vice versa in an n-channel-type MOSFET, a p-channel-type MOSFET can be obtained.

Figure 7:
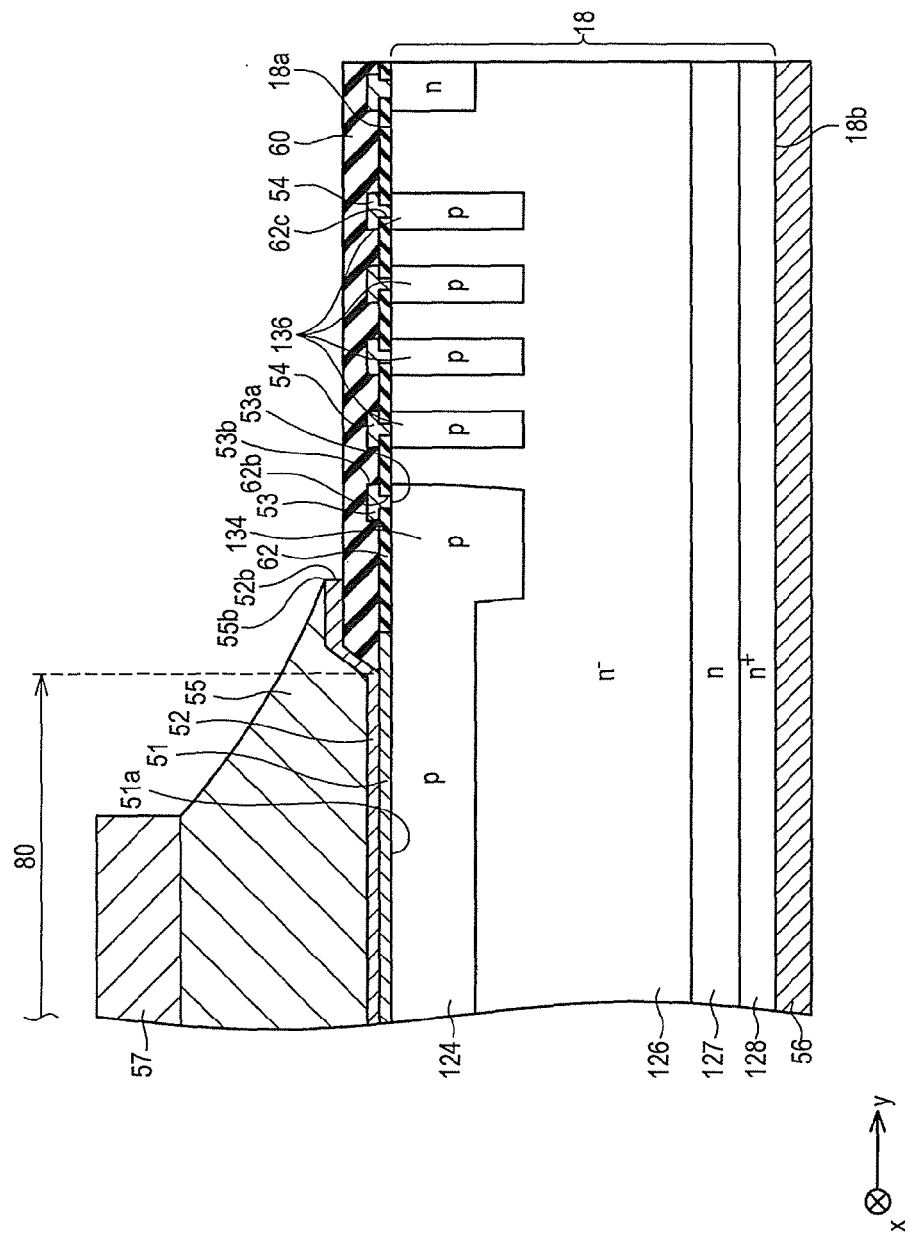
FIG. 7 is a longitudinal sectional view of a diode of Embodiment 3.

In Embodiment 3, a diode as shown in FIG. 7 will be described. The diode in Embodiment 3 includes the main electrode 51, the surface metallic layer 52, the solder layer 55, the metallic block 57, the peripheral electrode 53, the insulating protective film 60, and the lower electrode 56, as similar to the IGBT of Embodiment 1.

In the semiconductor substrate 18 of the diode of Embodiment 3, there are provided an anode region 124, a drift region 126, a buffer region 127, a cathode region 128, a terminal region 134, and FLRs 136.

The anode region 124 is a p-type region, and is disposed at a position where the anode region 124 is exposed to a center of the upper surface 18a of the semiconductor substrate 18. The anode region 124 is in ohmic contact with the main electrode 51 on the contact surface 51a.

The terminal region 134 is disposed in a range where the terminal region 134 is exposed to the upper surface 18a of the semiconductor substrate 18. The terminal region 134 is a p-type region connected to the anode region 124, and extends to a position deeper than the anode region 124. The terminal region 134 annularly extends in a manner as to surround a periphery of the anode region 124. The terminal region 134 is in ohmic contact with the peripheral electrode 53 on the contact surface 53*a* that annularly extends.

As similar to Embodiment 1, each FLR 136 is so provided as to surround the periphery of the terminal region 134.

The drift region 126 is an n-type region having a lower n-type impurity concentration. The drift region 126 is distributed under the entire anode region 124, under the entire terminal region 134, and circumferentially outward of the entire terminal region 134. The drift region 126 is in contact with the anode region 124 from a lower part of the anode region 124. The drift region 126 is in contact with the terminal region 134 from a lower part and a circumferentially-outward part of the terminal region 134. The terminal region 134 is separated from the FLR 136 by the drift region 126. The drift region 126 extends under and to the side part of each FLR 136. The drift region 126 is in contact with each FLR 136. Each FLR 136 is separated from each other by the drift region 126.

The buffer region 127 is an n-type region having a higher n-type impurity concentration than that of the drift region 126. The buffer region 127 is disposed under the drift region 126, and is in contact with the drift region 126 from a lower part of the drift region 126.

The cathode region 128 is an n-type region having a higher n-type impurity concentration than that of the buffer region 127. The cathode region 128 is disposed under the buffer region 127, and is in contact with the buffer region 127 from a lower part of the buffer region 127. The cathode region 128 is exposed to the lower surface 18*b* of the semiconductor substrate 18. The cathode region 128 is in ohmic contact with the lower electrode 56.

Operation of the diode of Embodiment 3 will be described, hereinafter. If an electric potential higher than that of the lower electrode 56 is applied to the main electrode 51, current flows from the main electrode 51 through the anode region 124, the drift region 126, the buffer region 127, and the cathode region 128 to the lower electrode 56. In other words, the diode is turned on. If the diode is turned on, the semiconductor substrate 18 generates heat.

In the opening 80, the heat is transferred from the semiconductor substrate 18 through the main electrode 51 and the surface metallic layer 52 to the solder layer 55. In the opening 80, no member for blocking the thermal conduction is present between the semiconductor substrate 18 and the solder layer 55. Hence, a temperature of the solder layer at an upper position in the opening 80 becomes higher. However, the circumferentially-outward end 55*b* of the solder layer 55 is not present at the upper position in the opening 80, and thus no high thermal stress is generated in the solder layer 55 in the opening 80.

Meanwhile, the circumferentially-outward end 55*b* of the solder layer 55 is provided on the insulating protective film 60. Since the insulating protective film 60 has a low thermal conductivity, the heat is hard to be transferred to the circumferentially-outward end 55*b* of the solder layer 55. Accordingly, increase in temperature of the circumferentially-outward end 55*b* of the solder layer 55 is suppressed. Through this, it is possible to prevent an excessively high thermal stress from being generated in the vicinity of the circumferentially-outward end 55*b* of the solder layer 55.

If a lower electric potential than that of the lower electrode 56 is applied to the main electrode 51, a depletion layer spreads from the anode region 124 and the terminal region 134 through the drift region 126. In the drift region 126 under the anode region 124 and the terminal region 134, the depletion layer extends long in the downward direction. In a circumferentially outer range of the terminal region 134, the depletion layer spreads from the terminal region 134 in a circumferentially outward direction (lateral direction). As similar to Embodiment 1, the depletion layer spreads via the multiple FLRs 136 in the circumferentially outward direction. The depletion layer spreads to the vicinity of the circumferentially-outward end surface of the semiconductor substrate 18.

In the depleted drift region 126, a difference in electric potential is generated. In the drift region 126 under the anode region 124 and the terminal region 134, a difference in electric potential is generated in the vertical direction. This means that the electric potential becomes gradually lower from the lower side toward the upper side. In the drift region 126 located circumferentially outward of the terminal region 134, a difference in electric potential is generated in the lateral direction in the vicinity of the upper surface 18*a* of the semiconductor substrate 18. This means that the electric potential becomes gradually lower from the circumferentially outward side toward the inner circumferential side. At a more circumferentially inward position than the circumferentially-outward end 53*b* of the peripheral electrode 53, almost no difference in electric potential in the lateral direction is generated in the vicinity of the upper surface 18*a* of the semiconductor substrate 18.

In the diode of Embodiment 3, the circumferentially-outward end 52*b* of the surface metallic layer 52 and the circumferentially-outward end 55*b* of the solder layer 55 are located more circumferentially inward than the circumferentially-outward end 53*b* of the peripheral electrode 53. Hence, the electric field distribution located circumferentially outward of the terminal region 134 is not disturbed. Therefore, according to the structure of the diode of Embodiment 3, it is possible to secure pressure resistance of the diode.

In the diode of Embodiment 3, the main electrode 51 may be connected to the peripheral electrode 53 as shown in FIG. 5. In the diode of Embodiment 3, the RESURF layer may be provided as shown in FIG. 6 instead of providing the FLRs.

The contact surface 51*a* in each Embodiment is an example of a main contact surface. The contact surface 53*a* in each Embodiment is an example of a peripheral contact surface. The body regions 24 and the anode region 124 in each Embodiment are an example of a first region. Each of the terminal regions 34 and 134 in each Embodiment is an example of a second region. Each of the drift regions 26 and 126 in each Embodiment is an example of a third region. The emitter regions 22 in each Embodiment are an example of a fourth region. The RESURF layer 58 in each Embodiment is an example of a low concentration region.

Technical elements disclosed in the present specification will be listed as below. The following technical elements are independently useful.

In a configuration example disclosed in the present specification, the semiconductor substrate includes a fourth region. The fourth region is a second conductive-type region that is in contact with a main electrode in the main contact surface, and is separated from the third region by the first region. The semiconductor device includes gate electrodes that face, via electric-insulating films, the first region in a range where the third region is separated from the fourth region. The second region is separated from the first region. The circumferentially-outward end of the surface metallic layer and the circumferentially-outward end of the solder layer are disposed on the second region.

In this configuration, the switching element is configured by the first region, the third region, the fourth region, and the gate electrodes. Since the second region is separated from the first region, no principal current flows to the second region when the switching element is turned on. Hence, less heat is generated in the second region. The circumferentially-outward end of the surface metallic layer and the circumferentially-outward end of the solder layer are disposed on the second region where less heat is generated. Accordingly it is possible to suppress increase in temperature of the circumferentially-outward end of the solder layer. According to this configuration, it is possible to protect the vicinity of the circumferentially-outward end of the solder layer.

In a configuration example disclosed in the present specification, the semiconductor substrate includes FLRs. The FLRs are the first conductive-type region that is exposed to the upper surface of the semiconductor substrate, is separated from the second region, and surrounds a periphery of the second region.

According to this configuration, the FLRs promote spread of the depletion layer in the outer circumference of the semiconductor substrate. Accordingly, it is possible to further promote enhancement of the pressure resistance of the semiconductor device.

In a configuration example disclosed in the present specification, the second region includes a high concentration region and a low concentration region. The high concentration region is in contact with the peripheral electrode. The low concentration region is a region that extends from the high concentration region in the circumferentially outward direction, and has a lower first conductive-type impurity concentration than that in the high concentration region.

According to this configuration, the low concentration region promotes the spread of the depletion layer circumferentially outward of the semiconductor substrate. Accordingly, it is possible to promote further enhancement of the pressure resistance of the semiconductor device.

As aforementioned, the embodiments of the present disclosure have been described in details, but these are merely exemplifications, and do not restrict the claims thereof. The art set forth in the claims includes variations and modifications of the specific examples set forth above. The technical elements disclosed in the present specification and or the drawings may exert technical advantages separately or in various types of combinations, and are not limited to the combinations set forth in the claims at the time of filing of the application. Furthermore, the art exemplified in the present specification and or the drawings may be utilized to achieve a plurality of aims simultaneously and the achievement of one of them itself exhibits technical advantages.

What is claimed is:

1. A semiconductor device comprising:
    a semiconductor substrate;
    a main electrode in contact with a main contact surface on an upper surface of the semiconductor substrate;
    a peripheral electrode in contact with a peripheral contact surface annularly extending on the upper surface of the semiconductor substrate in a manner as to surround a periphery of the main contact surface on the upper surface of the semiconductor substrate, the peripheral electrode electrically connected to the main electrode;
    an insulating protective film covering the periphery of the main electrode, the peripheral electrode, and a part of the upper surface of the semiconductor substrate that is located more circumferentially outward than the peripheral electrode, the insulating protective film exposing a center of the main electrode;
    a surface metallic layer disposed on the main electrode and extending from the main electrode onto the insulating protective film; and
    a solder layer on the surface metallic layer, wherein
    the semiconductor substrate includes:
        a first region of a first conductive-type in contact with the main electrode on the main contact surface;
        a second region of the first conductive-type in contact with the peripheral electrode on the peripheral contact surface; and
        a third region of a second conductive-type provided under the first region, under the second region, and circumferentially outward of the second region, and
        a circumferentially-outward end of the surface metallic layer and a circumferentially-outward end of the solder layer are located more circumferentially inward than the circumferentially-outward end of the peripheral electrode.

2. The semiconductor device according to claim 1, further comprising
    gate electrodes, wherein
    the semiconductor substrate includes a fourth region of the second conductive-type that is in contact with the main electrode on the main contact surface, and is separated from the third region by the first region,
    the gate electrodes face, via electric-insulating films, the first region in a range where the third region is separated from the fourth region,
    the gate electrodes separate the second region from the first region, and
    the circumferentially-outward end of the surface metallic layer and the circumferentially-outward end of the solder layer are disposed on the second region.

3. The semiconductor device according to claim 1, wherein
    the semiconductor substrate includes Field Limiting Rings of the first conductive-type exposed to the upper surface of the semiconductor substrate, the Field Limiting Rings separated from the second region by the third region, and the Field Limiting Rings surrounding a periphery of the second region.

4. The semiconductor device according to claim 1, wherein
    the second region includes:
        a high concentration region in contact with the peripheral electrode; and
        a low concentration region that extends circumferentially outward from the high concentration region and has a first conductive-type impurity concentration lower than the first conductive-type impurity concentration of the high concentration region.

5. The semiconductor device according to claim 1, wherein
    the solder layer is present across an entire surface of the surface metallic layer, and forms a fillet at an end of the surface metallic layer.

* * * * *